United States Patent
Ang et al.

(10) Patent No.: US 6,301,146 B1
(45) Date of Patent: Oct. 9, 2001

(54) STATIC RANDOM ACCESS MEMORY (RAM) SYSTEMS AND STORAGE CELL FOR SAME

(76) Inventors: Michael Anthony Ang, 115 Retiro Way, San Francisco, CA (US) 94123; Raymond A. Heald, 905 Spencer Way, Los Altos, CA (US) 94024; Roger Y. Lo, 1295 Longfellow Way, San Jose, CA (US) 95129

( * ) Notice: Subject to any disclaimer, the term of this patent is extended or adjusted under 35 U.S.C. 154(b) by 0 days.

(21) Appl. No.: 09/470,788

(22) Filed: Dec. 23, 1999

(51) Int. Cl.$^7$ .................................................. G11C 11/00
(52) U.S. Cl. ............................................ 365/154; 365/205
(58) Field of Search ..................................... 365/154, 205

(56) References Cited

U.S. PATENT DOCUMENTS

| | | | |
|---|---|---|---|
| 4,796,227 | 1/1989 | Lyon et al. | 365/154 |
| 4,821,235 | 4/1989 | Heald | 365/177 |
| 5,900,665 | * 5/1999 | Tobita | 257/357 |

OTHER PUBLICATIONS

Heald, R.A., "A Four–Device Bipolar Memory Cell," ISSCC Digest of Technical Papers, vol. 21, pp. 102–103, Feb. 1978.

Noda, K. et al., "A 1.9–$\mu m^2$ Loadless CMOS Four–Transistor SRAM Cell in a 0.18–$\mu m$ Logic Technology," IEDM Conference, Dec. 1998.

* cited by examiner

Primary Examiner—David Nelms
Assistant Examiner—M. Tran
(74) Attorney, Agent, or Firm—Richard Bee; John Schipper

(57) ABSTRACT

A method of continuously replenishing a four-transistor static RAM storage cell is described. Such method comprises biasing both the back gate terminals and the normal gate terminals of the two bit line coupling transistors in the static RAM storage cell to voltage levels for causing a flow of small compensating currents through such coupling transistors when they are in a standby or non-access condition. Such small compensating currents are supplied to the two storage transistors in the storage cell for replenishing leakage of charge from the parasitic capacitance in the storage cell. The bias voltages are supplied by adaptive bias circuits which adjust the bias voltages to track changes in the leakage of charge from the parasitic cell capacitance.

12 Claims, 8 Drawing Sheets

NON-ACCESS MODE
(NO READ OR WRITE)

READ MODE

WRITE MODE

NON-ACCESS MODE

STATIC RANDOM ACCESS MEMORY (RAM) SYSTEMS AND STORAGE CELL FOR SAME

DESCRIPTION

1. Technical Field

This invention relates to digital memory cells and memory systems. More particularly, it relates to static-type semiconductor random access memory (RAM) storage cells and systems.

2. Background of the Invention

Various forms of static and dynamic semiconductor storage cells are known in the art. Static cells continue to store data for as long as power is applied to them. In contrast, a dynamic storage cell must be periodically refreshed or it loses the data stored in it. Static cells are generally faster, consume less power and have lower error rates, but have the disadvantage of requiring more space on a semiconductor chip.

As is known, semiconductor storage cells rely on the charge on a parasitic cell capacitance to maintain the state of the cell when it is not being accessed. Unfortunately, this charge gradually leaks off and, if the cell is not accessed for a period of time, the cell is likely to lose its logic state. Dynamic cells solve this problem by periodically refreshing the charge on the appropriate parasitic capacitor. This is effective, but it increases the circuit complexity and decreases the cycle time. Static cells, on the other hand, solve the problem by providing additional circuitry in each storage cell for causing a small leakage current to flow through the cell during non-access periods in such a manner as to replenish the loss of charge on the parasitic capacitor. Unfortunately, this additional circuitry requires more space on the semiconductor chip.

Various forms of static and dynamic semiconductor storage cells are described in U.S. Pat. No. 4,796,227 granted to Richard F. Lyon and Richard R. Schediwy on Jan. 3, 1989. The descriptions in this Lyon and Schediwy patent are hereby incorporated into the present patent application by this reference thereto. The cell constructions described by Lyon and Schediwy have various advantages and disadvantages. Nevertheless, there remains room for further improvement, particularly with respect to cell performance.

SUMMARY OF THE INVENTION

The present invention provides an improved static semiconductor RAM storage cell with improved performance characteristics and an improved storage system using many such cells. The improvement is partly accomplished by making use of a largely ignored fourth terminal of a field effect transistor, namely, the body or substrate portion of the transistor. This body or substrate portion is sometimes referred to and will be herein referred to as the "back gate" terminal. In the present invention, a bias voltage is applied to the back gate terminals of the bit line coupling transistors in a static RAM storage cell for causing a flow of small compensating currents through the coupling transistors when they are in a non-access condition. These small compensating currents are supplied to the storage transistors in the storage cell for replenishing leakage of charge from the parasitic capacitance in the storage cell.

A bias voltage may also be applied to the normal gate terminals of the bit line coupling transistors for causing additional flow of compensating currents through the coupling transistors when they are in a non-access condition.

Adaptive bias circuits are provided for adaptively adjusting the bias voltages to track changes in the leakage of charge from the parasitic cell capacitance. These changes in leakage rate may be caused by variations in the manufacturing process, changes in supply voltages and chip voltage gradients, and changes in ambient and chip gradient temperatures. For a better understanding of the present invention, together with other and further advantages and features thereof, reference is made to the following description taken in connection with the accompanying drawings, the scope of the invention being pointed out in the appended claims.

BRIEF DESCRIPTION OF THE DRAWINGS

Referring to the drawings.

DETAILED DESCRIPTIONS OF THE ILLUSTRATED EMBODIMENTS

Figure 1A:
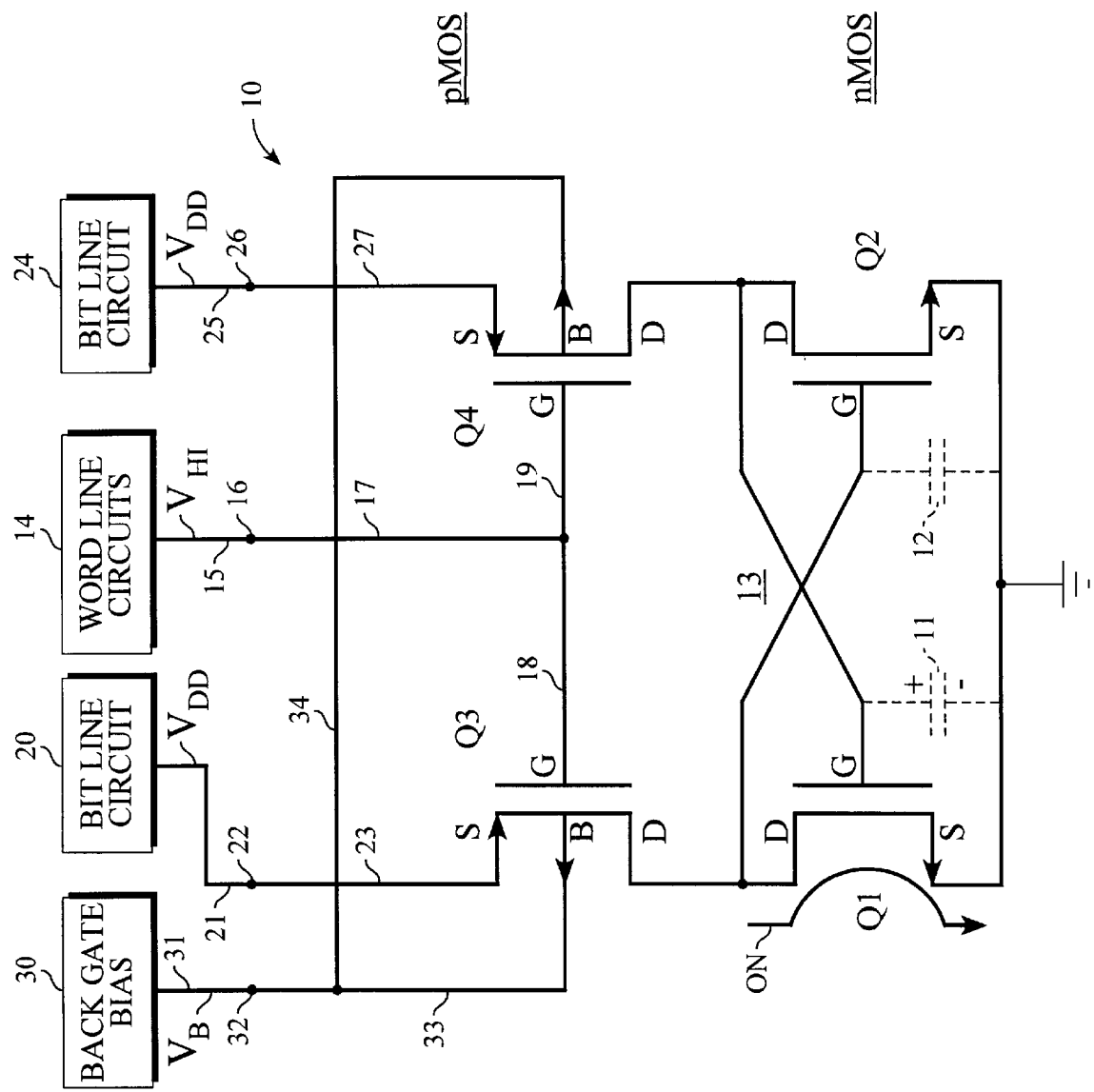
FIG. 1A is a schematic circuit diagram for a first embodiment of a static RAM storage cell constructed in accordance with the present invention, such cell being shown in a non-access or standby mode.

Referring to FIG. 1A, there is shown a static RAM (random access memory) storage cell 10 constructed in accordance with a first embodiment of the present invention. Storage cell 10 is a four-transistor storage cell comprising transistors Q1, Q2, Q3 and Q4. In the present embodiment, each of these transistors is a metal oxide semiconductor (MOS) type field effect transistor (FET). Each of transistors Q1–Q4 includes a source terminal S, a drain terminal D and a gate terminal G. Each of these transistors also includes a fourth terminal, namely, a back gate terminal B that is comprised of the body or substrate of the transistor. This back gate terminal is usually not mentioned and is usually not shown in circuit diagrams. This back gate terminal B is usually assumed to be connected internally to the source terminal S or to the appropriate power supply circuit and is normally not discussed in connection with the operation of the transistor. This back gate terminal B, however, can be of value and is used by the present invention to provide improved circuit performance. In FIG. 1A, this back gate terminal B is shown only for the case of transistors Q3 and Q4. Transistors Q1 and Q2 also have back gate terminals, but as is customary, they are not shown in the drawing because they do not play a significant role in the operation of these transistors Q1 and Q2. They are assumed to be locally connected to their respective source terminals. Transistors Q1 and Q2 constitute first and second storage transistors, which are cross-coupled to one another to form a bistable, circuit 13. More particularly, the drain terminal of Q1 is connected to the gate terminal of Q2, while the drain terminal of Q2 is connected to the gate terminal of Q1. The source terminals of transistors of Q1 and Q2 are connected to circuit ground. The parasitic capacitance associated with the gate of transistor Q1 is represented by a phantom line capacitor 11, while the parasitic capacitance associated with the gate of transistor Q2 is represented by a phantom line capacitor 12.

Transistors Q3 and Q4 constitute first and second bit line coupling transistors individually connected in series with different ones of the first and second storage transistors Q1 and Q2. These bit line coupling transistors Q3 and Q4 are used for reading the binary state of the bistable circuit 13 formed by Q1 and Q2 and for writing a desired binary state into such bistable circuit 13. The connection between Q3 and Q1 is a drain-to-drain connection with the drain terminal of Q3 being connected to the drain terminal of Q1. The drain terminal of coupling transistor Q4 is likewise connected to the drain terminal of storage transistor Q2. The present embodiment further includes word line circuitry for supplying access (turn-on) and non-access (turn-off) voltages to the normal gate terminals G of the coupling transistors Q3 and Q4. This circuitry includes word line circuits 14, a word line 15, a word line terminal 16, input conductor 17 and branch conductors 18 and 19, which run to the normal gate terminals G. The present embodiment also includes first and second bit line circuitry for selectively supplying a write voltage to the source terminals S of the first and second coupling transistors Q3 and Q4, respectively. The first bit line circuitry includes bit line circuit 20, bit line 21, bit line terminal 22, and a conductor 23 which runs to the source terminal S of coupling transistor Q3. The second bit line circuitry includes a bit line circuit 24, a bit line 25, a bit line terminal 26 and a conductor 27 which runs to the source terminal S of coupling transistor Q4.

The present embodiment further includes bias circuitry for supplying a bias voltage to the back gate terminals B of the coupling transistors Q3 and Q4 for causing a flow of small compensating currents through such coupling transistors Q3 and Q4 when they are in a non-access or standby condition. This back gate bias circuitry includes, for example, a back gate bias circuit 30, a bias line 31, a bias terminal 32, and conductors 33 and 34 which respectively run to the back gate terminals B of the coupling transistors Q3 and Q4.

The present embodiment also includes second bias circuitry for supplying a bias voltage to the normal gate terminals G of the coupling transistors Q3 and Q4 for causing a flow of additional compensating current through the coupling transistors Q3 and Q4 when they are in a non-access condition. This word-line bias circuitry is located in word line circuits 14 and will be discussed in greater detail in connection with FIG. 3. For the present, it should be noted that the leakage compensation currents flowing through coupling transistors Q3 and Q4 are produced by two different bias voltages, namely, the bias voltage $V_B$ supplied to the back gate terminals B and a second bias voltage supplied to the normal gate terminals G.

In the present embodiment, the storage transistors Q1 and Q2 are n-channel MOS field effect transistors, while the coupling transistors Q3 and Q4 are p-channel MOS field effect transistors.

The word line circuit 14 supplies an access voltage $V_{LO}$ of near zero volts and a non-access voltage $V_{HI}$ of near $V_{DD}$ Volts (greater than zero and less than $V_{DD}$ volts). $V_{DD}$ is the overall supply voltage for the storage cell 10. The write voltages supplied by bit line circuits 20 and 24 will have values of either zero volts or $V_{DD}$ volts, depending on the particular operational mode of the storage cell. In the present embodiment, the value of the back gate bias voltage supplied by back gate bias circuit 30 is designated as $V_B$ and has a value greater than zero volts and less than $V_{DD}$ volts. Optimum storage cell performance is obtained when this back gate bias voltage $V_B$ is less than $V_{DD}$ by an amount in the range of 0.5 to 0.67 of the back gate-to-source voltage drop of a p-channel field effect transistor. A typical value for this gate-to-source voltage drop of a p-channel field effect transistor is approximately 0.7 volts. FIG. 1A shows a hypothetical operating condition for the storage cell 10 when such cell is in a non-access or standby mode, that is when the cell is being neither read or written. In this hypothetical case, word line circuit 14 supplies a $V_{HI}$ voltage and bit line circuits 20 and 24 each supply a high voltage of near $V_{DD}$ volts. This places the coupling transistors Q3 and Q4 in a standby or non-access condition. The bistable circuit 13 formed by transistor Q1 and Q2 has two possible states. In one state, transistor Q1 is turned on (conductive) and transistor Q2 is turned off (nonconductive). The other state is the reverse condition where Q1 is off and Q2 is on. For sake of example, it is assumed that bistable circuit 13 is in a first state with Q1 on and Q2 off. In this state, the positive charge on parasitic capacitor 11 keeps Q1 turned on. When Q1 is on, its drain voltage level is very low (nearly ground value) and this keeps Q2 turned off. Unfortunately, the positive charge on parasitic capacitor 11 will gradually leak off and at some point in time the voltage on the gate terminal of Q1 may not be sufficient to keep Q1 turned on. In such event, the bistable circuit 13 loses its binary character.

This unwanted occurrence can be prevented by replenishing the charge on the parasitic capacitor 11 so as to keep Q1 turned on. The present invention accomplishes this by biasing the back gate terminals B and the normal gate terminals G of coupling transistors Q3 and Q4 so that such transistors are not completely turned off in the non-access mode of FIG. 1A. In other words, the back gates and normal gates of coupling transistors Q3 and Q4 are biased so that in the non-access mode small leakage compensation currents are cause to flow through such coupling transistors Q3 and Q4. These leakage compensation currents are supplied to the storage transistors Q1 and Q2 for replenishing the leakage of charge from the parasitic gate capacitance of the conductive storage transistor, in this example, the parasitic capacitor 11 for the gate of Q1. In this manner, the storage cell 10 is continually and statically "refreshed" and does not lose its binary state.

Similar considerations apply when the bistable circuit is in its second bistable condition. In this case, Q2 is turned on and Q1 is turned off. The positive charge on parasitic capacitor 12 keeps Q2 turned on and the leakage compensation current flow through coupling transistor Q3 caused by the gate biasing of coupling transistor Q3 keeps the charge on parasitic capacitor 12 continuously replenished.

Figure 1B:
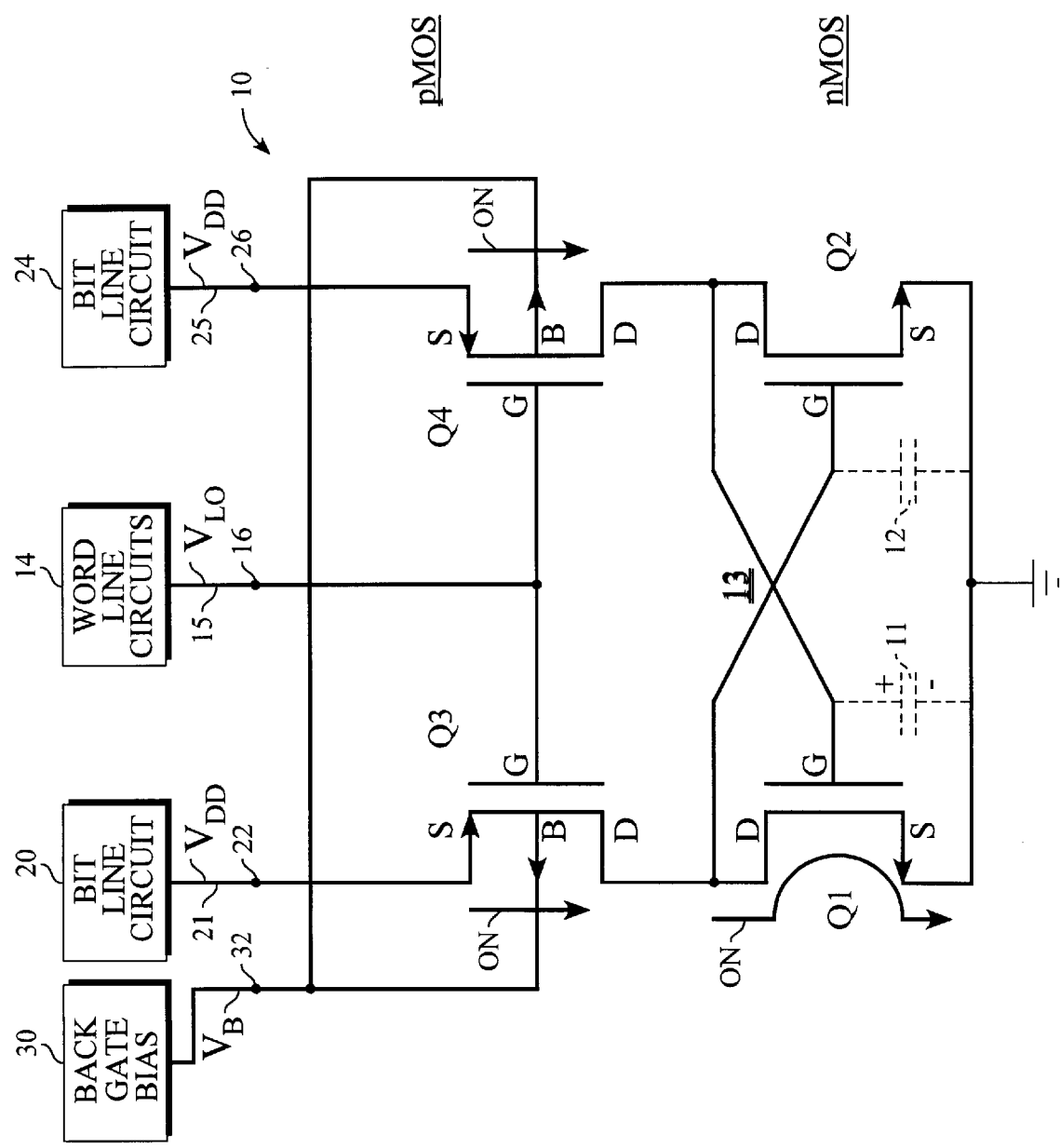
FIG. 1B shows the circuit of FIG. 1A in a read mode.

FIG. 1B shows the read mode of operation for the storage cell 10 of FIG. 1A. In this case, the word line circuit 14 supplies an access voltage $V_{LO}$ of very low value (near zero volts) to the normal gate terminals G of coupling transistors Q3 and Q4. This turns on coupling transistors Q3 and Q4, as indicated by the associated current flow lines. The state of the bistable circuit 13 is sensed by sensing the magnitudes of the currents flowing on bit lines 21 and 25. Since storage transistor Q1 is in the turned-on condition for the illustrated example, the current flow on bit line 21 will be significantly greater than the current flow on bit line 25. For the opposite binary state of bistable circuit 13, where Q1 is off and Q2 is turned on, the current flow on bit line 25 will be significantly larger. The turning on of both coupling transistors Q3 and Q4 in the read mode does not switch the state of the bistable circuit 13.

Figure 1C:
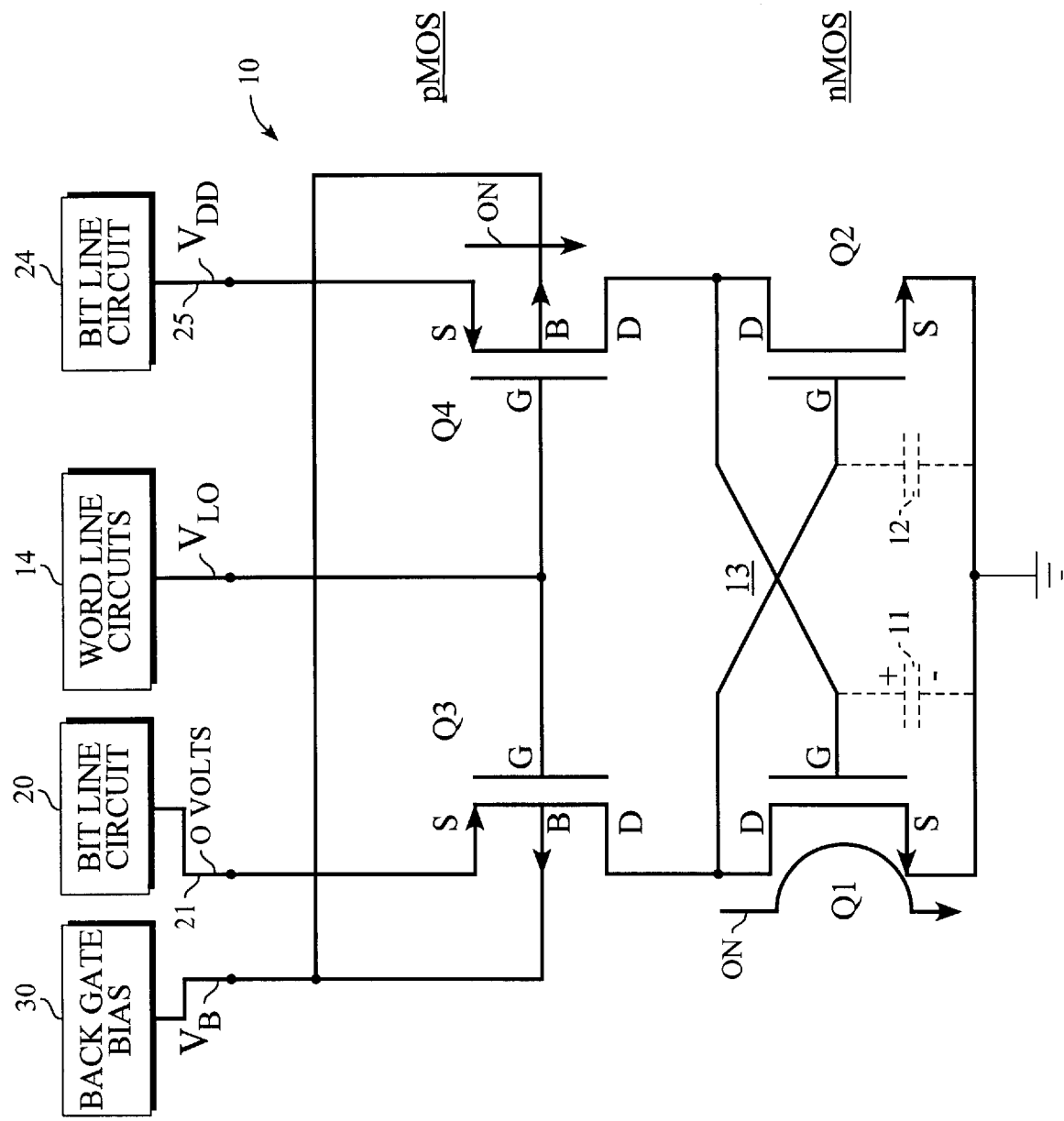
FIG. 1C shows the circuit of FIG. 1A in a write mode.

FIG. 1C shows one of the write modes for the storage cell 10 of FIG. 1A. The word line circuit 14 supplies an access voltage $V_{LO}$ of near zero volts to the gate terminals G of both of the coupling transistors Q3 and Q4. The bit line circuit 20 supplies a write voltage of near zero volts to the source terminal S of the coupling transistor Q3, while bit line circuit 24 continues to supply a near $V_{DD}$ voltage to the source terminal S of Q4. The combination of near zero voltages to both the source and gate terminals of Q3, keeps Q3 turned off if the drain of Q3 is low, or allows current to flow from drain to source in Q3 if the drain is high. On the other hand, the combination of near $V_{DD}$ voltage to the source and near zero voltage to the gate of Q4 allows current flow from source to drain in Q4, as shown. This allows the voltage at the drain of Q3 to drop and brings the voltage at the drain of Q4 up to approximately the $V_{DD}$ level. This $V_{DD}$ level is applied to the gate of storage transistor Q1 and charges up the parasitic capacitor 11 coupled to such gate terminal. This turns on the storage transistor Q1, if it is not already on. If Q1 is on, it remains on. Thus, for the bit line and word line voltages shown in FIG. 1C, bistable circuit 13 is set to the state where Q1 is on and Q2 is off.

If it is desired to set the bistable circuit 13 to the opposite state, then the first bit line circuit 20 is caused to supply a voltage of near $V_{DD}$ on its bit line 21 and the second bit line circuit 24 is caused to provide a voltage of near zero volts on its bit line 25. In this case, Q3 is turned on and Q4 is turned off. This allows the voltage at the drain of Q4 to drop and brings the voltage at the drain of Q3 up to approximately the $V_{DD}$ level. This turns on Q2 and turns off Q1, setting the bistable circuit 13 to the other of its two stable states.

Figure 2:
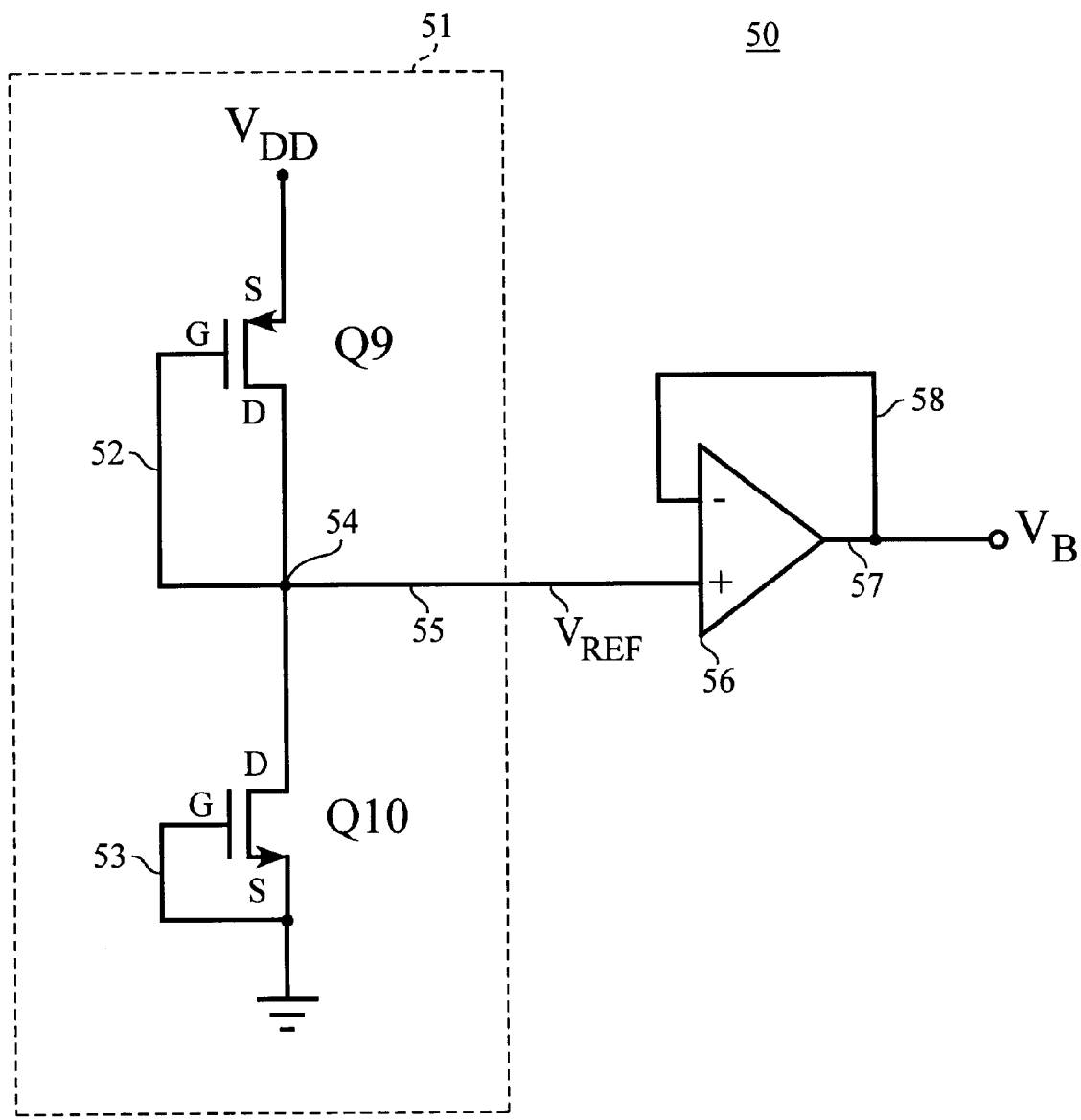
FIG. 2 is a schematic circuit diagram of an adaptive bias circuit constructed in accordance with the present invention.

Referring to FIG. 2 there is shown a schematic circuit diagram of an adaptive bias circuit 50 constructed in accordance with the present invention. This adaptive bias circuit 50 is useful for both the back gate bias circuit 30 of FIG. 1 and the biasing circuit portion of the word line circuits 14 for producing bias voltages for the back gate and normal gate terminals of the coupling transistors in a large number of storage cells. The adaptive bias circuit 50 is formed on the same semiconductor substrate, as are the storage cells to be biased. This enables the bias circuit to track variations caused by differences in the chip manufacturing process.

The adaptive bias circuit 50 comprises a reference voltage cell 51 having first and second field effect transistors Q9 and Q10 of opposite channel type formed on the same semiconductor substrate as the storage cells to be biased. Each of transistors Q9 and Q10 includes a source terminal S, a gate terminal G, and a drain terminal D. These transistors Q9 and Q10 are connected in series with one another in a drain-to-drain manner. Transistor Q9 is of the same type as the bit line coupling transistors (e.g. Q3 and Q4) in the various storage cells. Transistor Q10, on the other hand, is of the same type as the storage transistors (e.g., Q1 and Q2) in the storage cells. In a representative embodiment, these transistors are of the metal oxide semiconductor (MOS) type. The drain terminal D of transistor Q9 is connected to the gate of such transistor Q9 by conductor 52. The source terminal S of the transistor Q10 is connected to the gate terminal G of such transistor Q10 by a conductor 53. The source terminal of the upper transistor Q9 is connected to the substrate supply voltage source $V_{DD}$ and the source terminal S of the lower transistor Q10 is connected to circuit ground. A junction point 54 between the two transistors Q9 and Q10 is connected to a reference cell output conductor 55 which provides a reference voltage $V_{REF}$.

The adaptive bias circuit 50 further includes an operational amplifier circuit 56 formed on the same substrate as the storage cells to be biased. One input of operational amplifier 56 is connected to the junction 54 between transistors Q9 and Q10. An output 57 of the operational amplifier 56 provides an adaptive bias voltage $V_B$ for the storage cells to be biased. The output 57 is connected back to a second input of the operational amplifier 56 by way of a conductor 58. Operational amplifier 56 is constructed to have a unity gain factor. Thus, $V_B$ is equal to the reference voltage $V_{REF}$ produced by the reference cell 51.

The reference voltage cell 51 is subjected to the same environmental factors (for example, substrate temperature and supply voltage value), as are the storage cells to the biased. Consequently, the reference cell voltage $V_{REF}$ is affected by these environmental factors in the same manner as is the leakage of charge form the parasitic capacitances in the storage cells. In other words, changes in these environmental factors cause $V_{REF}$ to increase and decrease in the same manner as such factors cause the leakage of parasitic charge to increase and decrease. Thus, environmentally induced changes in the value of $V_{REF}$ automatically track and compensate for environmentally induced changes in the rate of leakage of charge from the parasitic capacitances in the storage cells.

The gate-to-source connection of the lower transistor Q10 keeps the lower transistor Q10 in a basically turned off condition with a relatively small current flow from drain-to-source. The gate-to-drain connection of the upper transistor Q9 causes Q9 to behave like a diode with the resulting source-to-drain voltage drop corresponding approximately to the gate-to-source voltage drop for the coupling transistors in the memory cells. Transistors Q9 and Q10 are constructed so that the magnitude of $_{REF}$ biases coupling transistors Q3 and Q4 of FIG. 1 at the edge of the sub-threshold region.

The reference voltage $V_{REF}$ increases and decreases in a manner so as to track the changes in the leakage of charge from the parasitic capacitance in the storage cells. In particular, the reference voltage $V_{REF}$ automatically adjusts as the rate of leakage of charge from the parasitic capacitance in the storage cell increases. This increases the magnitude of the compensating currents supplied to the storage transistors in the storage cells.

Operational amplifier 56 provides the power needed to supply the bias voltage $V_B$ for a large number of memory cells. For the case of the memory cell 10 of FIG. 1, the output voltage $V_B$ of FIG. 2 is the bias voltage which is applied to the back gate terminals B of the coupling transistors Q3 and Q4 in such memory cell.

Figure 3:
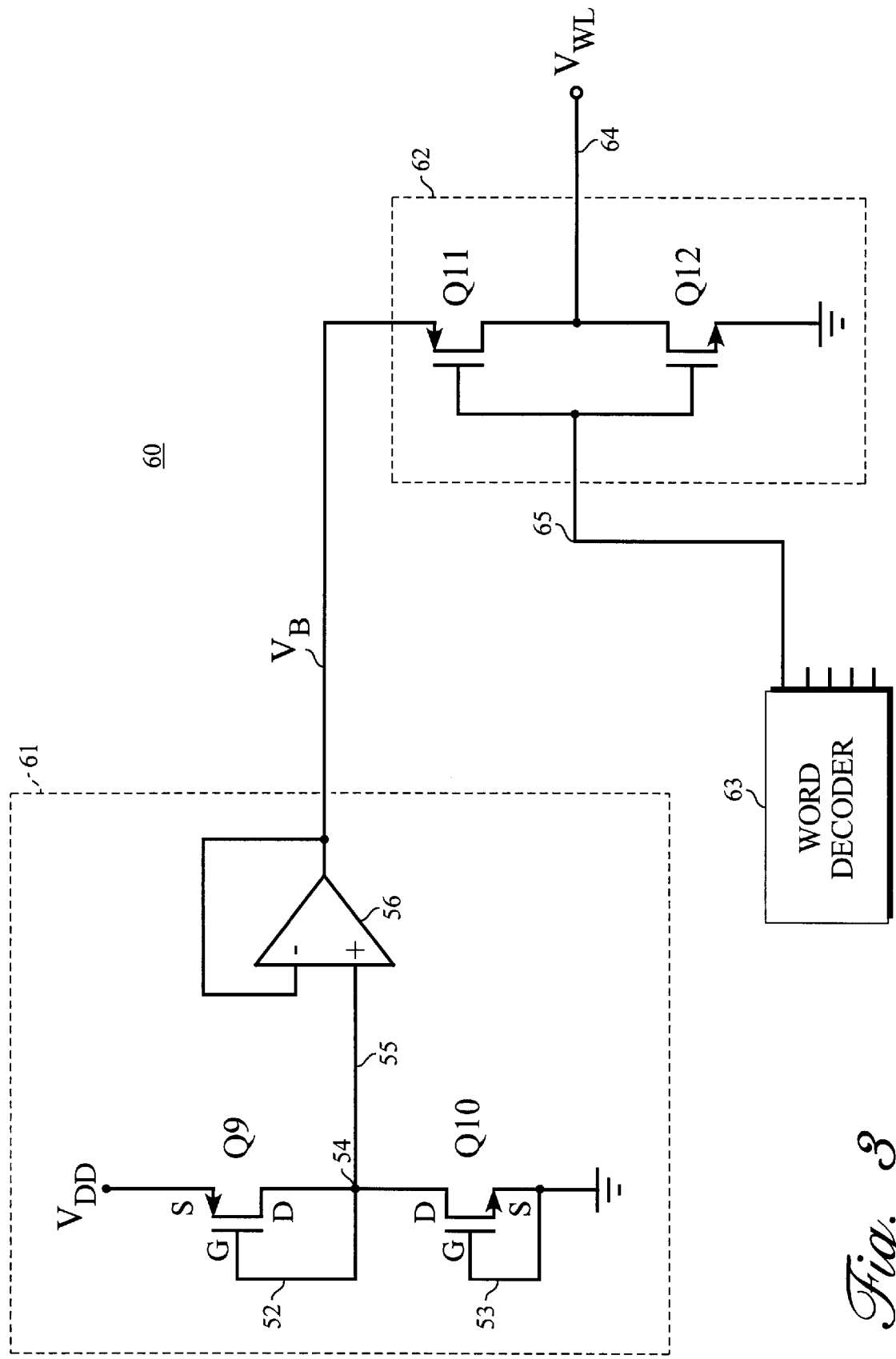
FIG. 3 shows word line circuits, which are used for controlling and for biasing the normal gate (word line) terminals of the coupling transistors.

Referring to FIG. 3, there is shown a representative form of construction for word line circuits 60 for controlling and biasing the normal gate terminals of bit line coupling transistors in storage cells. Word line circuits 60 correspond to word line circuits 14 of FIG. 1. As indicated in FIG. 3, word line circuits 60 include an adaptive bias circuit 61, a word line driver 62 and a word decoder 63. Bias circuit 61 of FIG. 3 is of the same construction and operates in the same manner as the bias circuit 50 of FIG. 2. Word decoder 63 serves to select a particular line of storage cells to be accessed in a multiple-line storage array. Driver circuit 62 is comprised of transistors Q11 and Q12 and supplies on an output line 64 the word line access voltage $V_{WL}$ for a particular line of storage cells. Conductor 64 corresponds to word line conductor 15 in FIG. 1. The word line voltage $V_{WL}$, has a first value $V_{HI}$ when the storage cells are not being accessed and has a second value $V_{LO}$ when the storage cells are being accessed. When the storage cells connected to driver circuit 62 are to be accessed, the decoder output line 65 from word decoder 63 goes to a high voltage level. This turns on the driver transistor Q12 and lowers the word line voltage on conductor 64 to the $V_{LO}$ value, which is the value needed to access the storage cells.

When the storage cells controlled by driver circuit 62 are not being accessed, the decoder output line 65 is at a low near zero voltage level $V_{LO}$ lower transistor Q12 is turned off. This raises the driver output line 64 to the non-access $V_{HI}$ value. The value of $V_{HI}$ is selected to provide a bias voltage for the normal gate terminals G of the bit line coupling transistors for causing a flow of additional compensating currents through such coupling transistors. This value is determined by the reference voltage $V_B$ from the bias circuit 61 and the voltage drop across the upper transistor Q11. The low voltage level on driver input conductor 65 causes upper transistor Q1 to be turned on during the non-access mode. In this manner, the driver circuit 62 supplies a bias voltage to the normal gate electrodes G of the coupling transistors in the storage cells when such storage cells are in a non-access mode. Since the voltage $V_B$ changes to track changes in the leakage of charge from the parasitic gate capacitances in the storage cells, the word line bias voltage on conductor 64 also changes to track changes in the leakage of such parasitic charge.

Figure 3A:
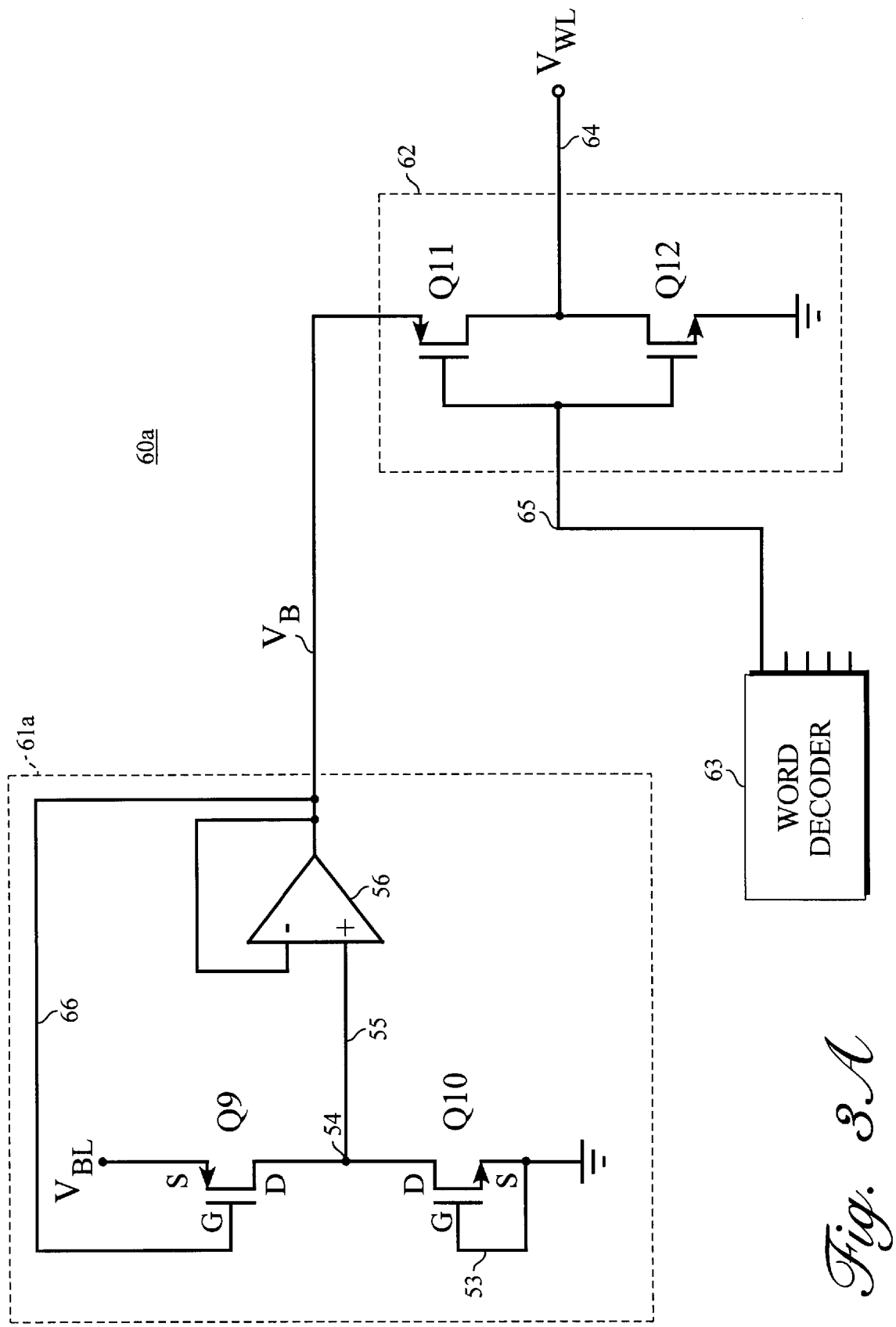
FIG. 3A shows a modified embodiment of the word line circuits of FIG. 3.

Referring to FIG. 3A, there is shown a modified embodiment 60a of the word line circuits 60 of FIG. 3. Driver circuit 62 and word decoder 63 are the same as in FIG. 3. The construction of modified bias circuit 61a includes two changes for further enhancing the biasing of memory cells in an array of memory cells. The first change comprises deleting the gate to drain connection (conductor 52) of the upper transistor Q9 and instead connecting the gate of Q9 via conductor 66 to the output of the operational amplifier 56. This provides better compensation for operational amplifier offset. The second change comprises connecting the source terminal S of the upper transistor Q9 to a different voltage source, namely, a bit line voltage source $V_{BL}$ which provides a likeness or replica of the average bit line voltage of the memory cells in an array of memory cells. This enables the adaptive bias voltage $V_B$ to better track environmental changes in the leakage of charge from the parasitic capacitance in the memory circuits of the memory cells of the array. Either one or both of these changes may be implemented in any given memory cell array.

Figure 4:
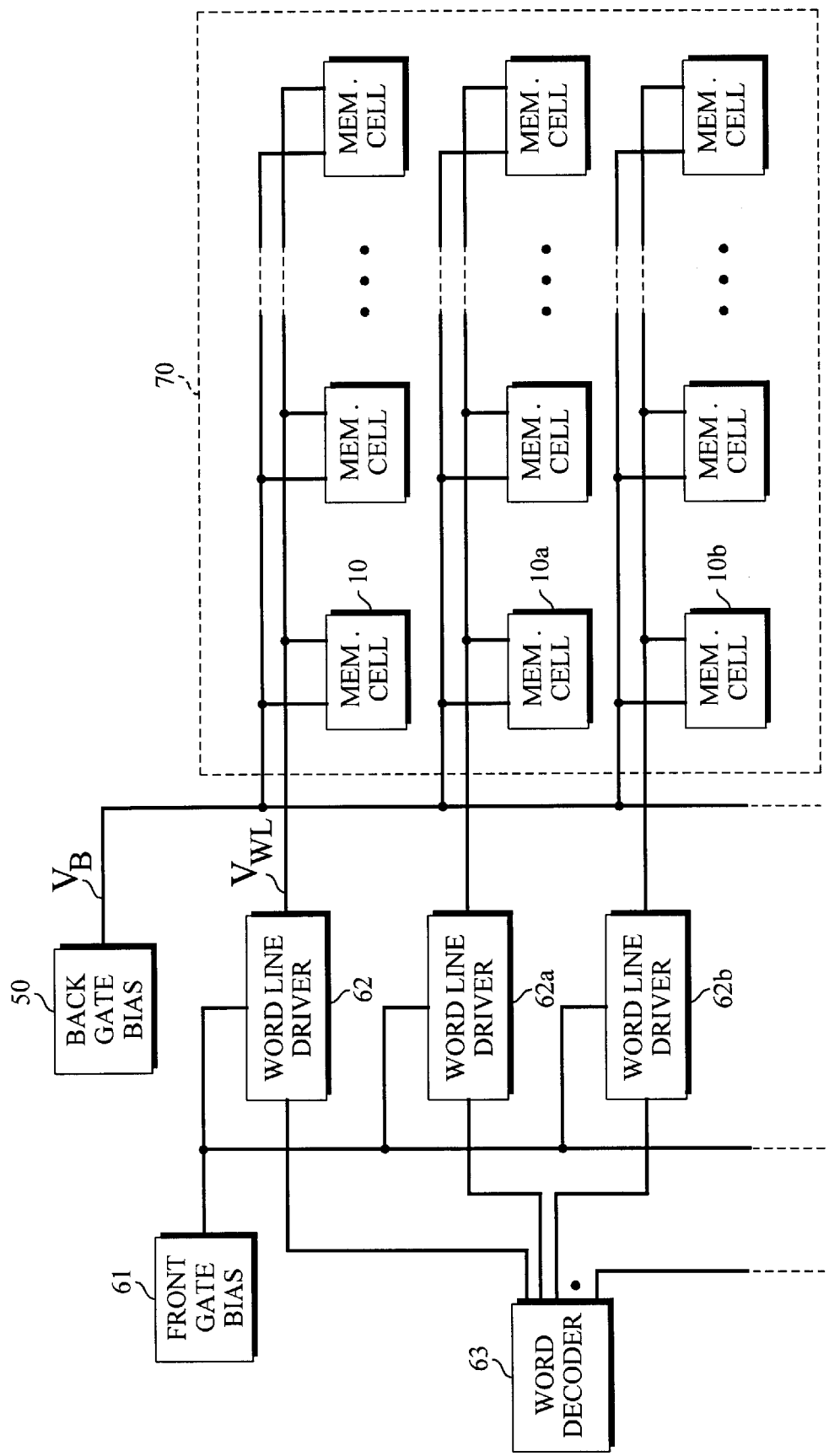
FIG. 4 shows circuitry for connecting bias circuits to an array of memory cells.

Referring to FIG. 4 there is shown the manner in which the adaptive bias circuits of FIGS. 2 and 3 (or 3A) are connected to an array of memory cells 70. As indicated in FIG. 4, the back gate bias voltage $V_B$ from back gate bias circuit 50 is supplied to each and every one of the memory cells in the array 70. This bias voltage $V_B$ is supplied to the back gate terminals B of the bit line coupling transistors in such memory cells in the same manner as shown in FIG. 1 for memory cell 10.

The normal gate bias voltage produced by front gate bias circuit 61 (either bias circuit 61 of FIG. 3 or bias circuit 61a of FIG. 3A) is supplied to the different memory cells by way of their respective word line drivers 62, 62a, 62b, etc. Each of word line drivers 62a, 62b, etc. is of the same form of construction as shown in FIG. 3 for the word line driver circuit 62. Word decoder 63 decodes a received word address and activates the corresponding one of the word line drivers by placing its input line at a high voltage level.

Figure 5:
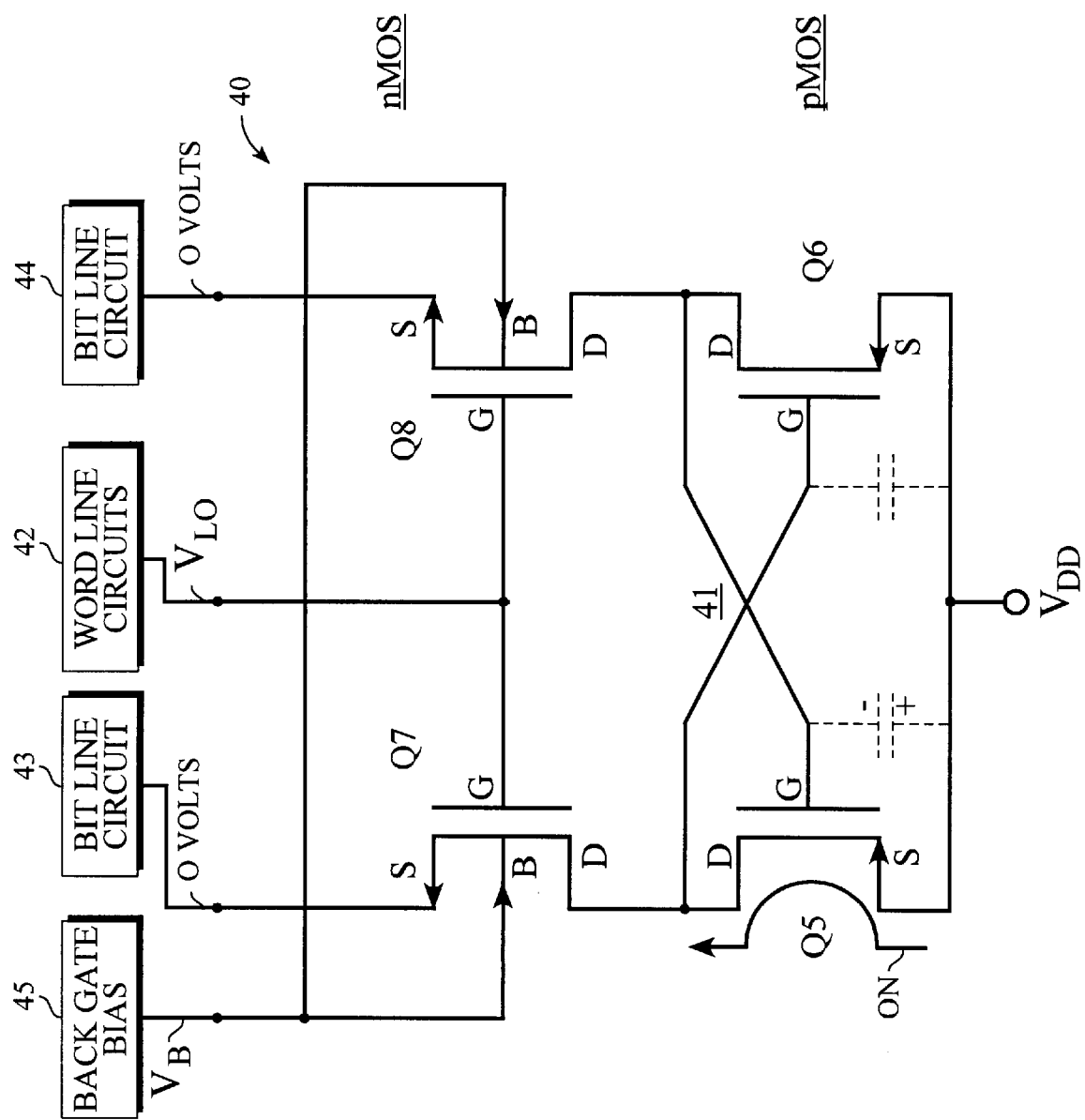
FIG. 5 is a schematic circuit diagram of a second embodiment of a static RAM storage cell constructed in accordance with the present invention.

Referring now to FIG. 5 of the drawings, there is shown a static RAM storage cell 40 constructed in accordance with a second embodiment of the present invention. In this embodiment, the channel types for the storage transistors and the bit line coupling transistors are reversed. In particular, FIG. 5 shows a pair of storage transistors Q5 and Q6, which are cross-coupled to form a bistable circuit 41. In this case, storage transistors Q5 and Q6 are p-channel MOS field-effect transistors. The storage cell 40 further includes first and second bit line coupling transistors Q7 and Q8 individually connected in series with the different ones of the first and second storage transistors Q5 and Q6. In the FIG. 5 case, the bit line coupling transistors Q7 and Q8 are n-channel MOS field-effect transistors. The voltages shown in FIG. 5 are for the non-access or standby mode.

A word line circuit 42 supplies access and non-access voltages to the normal gate terminals G of coupling transistors Q7 and Q8. The non-access voltage has a value of $V_{LO}$, while the access voltage has a value of $V_{HI}$. If the bistable circuit 41 is being read, bit line circuits 43 and 44 supply near zero voltage to the source terminals of coupling transistors Q7 and Q8. If a write mode operation is being performed, the appropriate one of bit line circuits 43 and 44 is caused to supply a voltage of near $V_{DD}$ volts to its coupling transistor, the other bit line circuit supplying the near zero voltage to its coupling transistor.

A back gate bias circuit 45 supplies a bias voltage of $V_B$ to the back gate terminals B of the coupling transistors Q7 and Q8 for causing a flow of small leakage compensating currents through such coupling transistors Q7 and Q8 when they are in a non-access condition. This back gate bias voltage is more positive than zero volts and less positive than the $V_{DD}$ supply voltage. For optimum performance, this back gate bias voltage $V_B$ has a magnitude in a range of 0.5 to 0.67 of the back gate-to-source voltage drop of an n-channel field effect transistor. As in FIG. 1 embodiment, it is also desired to bias the normal gate terminals G of the coupling transistors to provide some of the compensating current flow. This biasing of the back gates and normal gates of coupling transistors Q7 and Q8 keeps Q7 and Q8 slightly turned on when the word line voltage supplied by word line circuit 42 is supplying the non-access value of near zero volts. The consequent small current flow through coupling transistors Q7 and Q8 serves to replenish the leakage of charge from the parasitic gate capacitance of the non-conductive one of storage transistors Q5 and Q6.

While there have been described what are at present to be preferred embodiments of this invention, it will be obvious to those skilled in the art that various changes and modifications may be made therein without departing from the invention and it is, therefore, intended to cover all such changes and modifications as come within the true spirit and scope of the invention.

What is claimed is:

1. An adaptive bias circuit for producing a bias voltage for storage cells formed on a semiconductor substrate, the bias circuit comprising:
    first and second field-effect transistors of opposite channel type formed on the same substrate as the storage cells, the transistors being connected in series with one another and being connected to an adaptive voltage source having a voltage value equal to the average bit line voltage of a selected group of the storage cells; and
    an amplifier circuit formed on the same substrate as the storage cells and having an input connected to the junction between the transistors and having an output for providing an adaptive bias voltage for the storage cells.

2. The adaptive bias circuit of claim 1 wherein said series-connected transistors are connected to said supply voltage source used by said storage cells.

3. The adaptive bias circuit of claim 1 wherein said amplifier circuit is an operational amplifier circuit.

4. An adaptive bias circuit for producing a bias voltage for storage cells formed on a semiconductor substrate, the bias circuit comprising:

first and second field-effect transistors of opposite channel type formed on the same substrate as the storage cells, such transistors being connected in series with one another; and an operational amplifier circuit, having a unity gain factor, being formed on the same substrate as the storage cells, having an input terminal connected to the junction between the transistors, and having an output terminal for providing an adaptive bias voltage for the storage cells.

5. An adaptive bias circuit for producing a bias voltage for storage cells formed on a semiconductor substrate, the bias circuit comprising:

first and second field-effect transistors of opposite channel type formed on the same substrate as the storage cells, such transistors being connected in series with one another, wherein a gate terminal and a drain terminal of the first transistor are connected together and a gate terminal and a source terminal of the second transistor are connected together; and an amplifier circuit formed on the same substrate as the storage cells and having an input terminal connected to the junction between the transistors and having an output terminal for providing an adaptive bias voltage for the storage cells.

6. An adaptive bias circuit for producing a bias voltage for storage cells formed on a semiconductor substrate, the bias circuit comprising:

first and second field-effect transistors of opposite channel type formed on the same substrate as the storage cells, such transistors being connected in series with one another; and an amplifier circuit formed on the same substrate as the storage cells and having an input terminal connected to the junction between the transistors and having an output terminal for providing an adaptive bias voltage for the storage cells, wherein a gate terminal of the first transistor is connected to an output terminal of the amplifier circuit and a gate terminal and a source terminal of the second transistor are connected together.

7. An adaptive bias circuit for producing a bias voltage for storage cells formed on a semiconductor substrate, the bias circuit comprising:

first and second field-effect transistors of opposite channel type formed on the same substrate as the storage cells, such transistors being connected in series with one another, wherein a drain terminal of the first transistor is connected to a drain terminal of the second transistor, a source terminal of the first transistor is connected to a higher level voltage source and a source terminal of the second transistor is connected to a lower level voltage source; and an amplifier circuit formed on the same substrate as the storage cells and having an input terminal connected to the junction between the transistors and having an output terminal for providing an adaptive bias voltage for the storage cells.

8. The adaptive bias circuit of either claim 7, wherein said gate terminal and a drain terminal of said first transistor and said gate terminal and said source terminal of said second transistor are connected together.

9. The adaptive bias circuit of either claim 7, wherein a gate terminal of said first transistor is connected to an output terminal of said amplifier circuit and a gate terminal and a source terminal of said second transistor are connected together.

10. An adaptive bias circuit for producing a bias voltage for storage cells formed on a semiconductor substrate, the bias circuit comprising:

first and second field-effect transistors of opposite channel type formed on the same substrate as the storage cells, such transistors being connected in series with one another, wherein a drain terminal of the first transistor is connected to a drain terminal of the second transistor, a source terminal of the first transistor is connected to an adaptive voltage source having a voltage value equal to an average bit line voltage of a selected group of storage cells and a source terminal of the second transistor is connected to a lower level voltage source; and an amplifier circuit formed on the same substrate as the storage cells and having an input terminal connected to the junction between the transistors and having an output terminal for providing an adaptive bias voltage for the storage cells.

11. The adaptive bias circuit of either claim 10, wherein a gate terminal and said drain terminal of said first transistor are connected together and a gate terminal and said source terminal of said second transistor are connected together.

12. The adaptive bias circuit of either claim 10, wherein a gate terminal of said first transistor is connected to an output terminal of said amplifier circuit and a gate terminal and a source terminal of said second transistor are connected together.

* * * * *